(12) United States Patent
Böhm et al.

(10) Patent No.: US 6,442,100 B2
(45) Date of Patent: Aug. 27, 2002

(54) INTEGRATED MEMORY

(75) Inventors: Thomas Böhm, Zorneding; Georg Braun, München, both of (DE); Heinz Hönigschmid, East Fishkill, NY (US); Zoltan Manyoki, Kanata (CA); Thomas Röhr, Aschheim (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/904,358

(22) Filed: Jul. 12, 2001

Related U.S. Application Data

(63) Continuation of application No. PCT/DE00/00025, filed on Jan. 3, 2000.

(30) Foreign Application Priority Data

Jan. 12, 1999 (DE) .......................................... 199 00 802

(51) Int. Cl.[7] ................................................ G11C 8/00

(52) U.S. Cl. .................................. 365/230.06; 365/195

(58) Field of Search ....................... 365/230.06, 230.08, 365/195, 145, 189.07

(56) References Cited

U.S. PATENT DOCUMENTS

| | | | | |
|---|---|---|---|---|
| 5,293,332 A | * | 3/1994 | Shirai | 365/230.06 |
| 5,347,486 A | * | 9/1994 | Urai | 365/230.06 |
| 5,511,031 A | | 4/1996 | Grover et al. | 365/208 |
| 5,905,689 A | * | 5/1999 | Oh | 365/230.06 |
| 5,953,275 A | | 9/1999 | Sugibayashi et al. | 365/207 |
| 5,963,500 A | * | 10/1999 | Taura | 365/230.06 |
| 6,064,622 A | * | 5/2000 | Lee et al. | 365/230.06 |
| 6,262,933 B1 | * | 7/2001 | Chang et al. | 365/230.06 |

* cited by examiner

*Primary Examiner*—Tan T. Nguyen
(74) *Attorney, Agent, or Firm*—Laurence A. Greenberg; Werner H. Stemer; Gregory L. Mayback

(57) ABSTRACT

The integrated memory has m>1 bit lines that are connected to an input of a read-write amplifier via a switching element. Only one switching element is conductively connected for each read or write access. The memory is provided with a switching unit that influences read or write access occurring by way of the read-write amplifier and bit lines. The circuit unit is provided with an activation input. A column-end decoder has a first decoder stage and m second decoder stages. The outputs of the second decoder stages are connected to a control input for each of the switching elements. The output of the first decoder stage is connected to the activation input of the switching unit.

4 Claims, 4 Drawing Sheets

INTEGRATED MEMORY

CROSS-REFERENCE TO RELATED APPLICATION

This application is a continuation of copending International Application No. PCT/DE00/00025, filed Jan. 3, 2000, which designated the United States.

BACKGROUND OF THE INVENTION

Field of the Invention

The invention lies in the field of integrated memory technology. More specifically, the invention pertains to an integrated memory device.

U.S. Pat. No. 5,517,446 describes an integrated memory in the form of a ferroelectric memory (FRAM or FeRAM). There, the memory cells are connected to bit lines which are respectively combined to form bit line pairs. Each bit line pair is connected to a data line pair via a sense amplifier. In the event of a write access, data are transferred to one of the memory cells via the data line pair and the sense amplifier and also the bit line pair. In the event of a read access, the data transfer takes place in the opposite direction from one of the memory cells via the bit line pair to the sense amplifier, which forwards a differential signal established on the bit line pair to the data line pair after having amplified it. In order to save energy, according to U.S. Pat. No. 5,517,446, it is always the case that only those sense amplifiers are activated via which a data transfer has to take place in the event of the current write or read access. For the same reason, the bit lines are likewise precharged only in the case in which data are to be transferred via them. This is achieved by the activation of the sense amplifier and also the precharging of the bit line pair taking place in dependence on the same signal by which the respectively selected sense amplifier is connected to the associated data line pair. This signal is decoded from column addresses by a column decoder. An output signal which is decoded by the column decoder and which the latter generates in its last decoder stage thus serves both for connecting the bit lines to the data lines, for activating the sense amplifier and also for activating the precharging of the bit line pair.

H. Fujisawa describes an FRAM in "The Charge-Share Modified (CSM) Precharge-Level Architecture for High-Speed and Low-Power Ferroelectric Memory" in: IEEE Journal of Solid-State Circuits, Vol. 32, No. 5, May 1997, page 655 et seq. In that FRAM a relatively large number of bit lines are in each case assigned to the same sense amplifier. These bit lines are connected to the sense amplifier via a multiplexer.

SUMMARY OF THE INVENTION

The object of the present invention is to provide an integrated memory which overcomes the above-noted deficiencies and disadvantages of the prior art devices and methods of this general kind, and which has a plurality of bit lines per sense amplifier, in which write or read accesses to memory cells of the memory which take place via the sense amplifier and the bit lines are influenced in a simple manner.

With the above and other objects in view there is provided, in accordance with the invention, an integrated memory, comprising:

a plurality of memory cells and a number m>1 bit lines connected to the memory cells, switching elements connected to the bit lines and each having a control input, a sense amplifier having an input connected via the switching elements to the bit lines for transferring data from or to the memory cells;

a circuit unit for influencing write or read operations via the sense amplifier and the bit lines, the circuit unit having an activation input for placing the circuit unit into an activated state;

a column decoder having a first decoder stage and m second decoder stages;

the first decoder stage having inputs for receiving address signals and an output connected to the activation input of the circuit unit; and the second decoder stages each having an input connected to the output of the first decoder stage, at least one further input for receiving a further address signal, and an output connected to the control input of a respective one of the switching elements.

In other words, the integrated memory according to the invention has m>1 bit lines which are connected via a respective switching element to an input of a sense amplifier, for transferring data from or to memory cells connected to the bit lines. Furthermore, the memory has a circuit unit for influencing write or read accesses to the memory cells which take place via the sense amplifier and the bit lines, which has an activation input via which it can be put into an activated state. The memory has a column decoder having a first and m second decoder stages, the first decoder stage having inputs for feeding in address signals and an output, and the second decoder stages each having an input which is connected to the output of the first decoder stage, at least one further input for feeding in a further address signal, and an output. The outputs of the second decoder stages are connected to a control input of a respective one of the switching elements. The output of the first decoder stage is connected to the activation input of the circuit unit.

In the case of the invention, a write or read access is influenced for all the bit lines—connected to the sense amplifier—by means of the circuit unit via a common signal, namely that signal which is generated at the output of the first decoder stage. Although hierarchical decoders having a plurality of decoder stages connected in series, as are also provided by the invention, are known in principle, usually only the outputs of the last decoder stage are used for influencing circuit units connected downstream. This also applies, for example, to U.S. Pat. No. 5,517,446 A mentioned in the introduction. In the case of the invention, the control inputs of the switching elements are connected to the outputs of the second decoder stages. In addition, in the case of the invention, the output signal of the first decoder stage upstream of the second decoder stages is unconventionally used for driving the circuit unit. As a consequence of this, the circuit unit is activated via the output signal of the first decoder stage whenever one of the first switching elements is turned on via the output of an arbitrary one of the second decoder stages.

In accordance with an added feature of the invention, the circuit unit is configured to activate the sense amplifier in the activated state. According to this first embodiment of the invention, the circuit unit activates the sense amplifier in the activated state. This can be done for example by connecting the sense amplifier to a supply potential.

In accordance with an additional feature of the invention, the circuit unit connects the sense amplifier to a data line in the activated state, the data line serving for transferring, to a point outside the integrated memory, data that have been read from the memory cells and amplified by the sense amplifier. In this embodiment, the circuit unit connects the sense amplifier to a data line in the activated state, the data line serving for transferring, to a point outside the memory, data that have been read from the memory cells and amplified by the sense amplifier.

In accordance with a concomitant feature of the invention, the circuit unit precharges the input of the sense amplifier to a specific potential in the activated state.

Other features which are considered as characteristic for the invention are set forth in the appended claims.

Although the invention is illustrated and described herein as embodied in an integrated memory, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
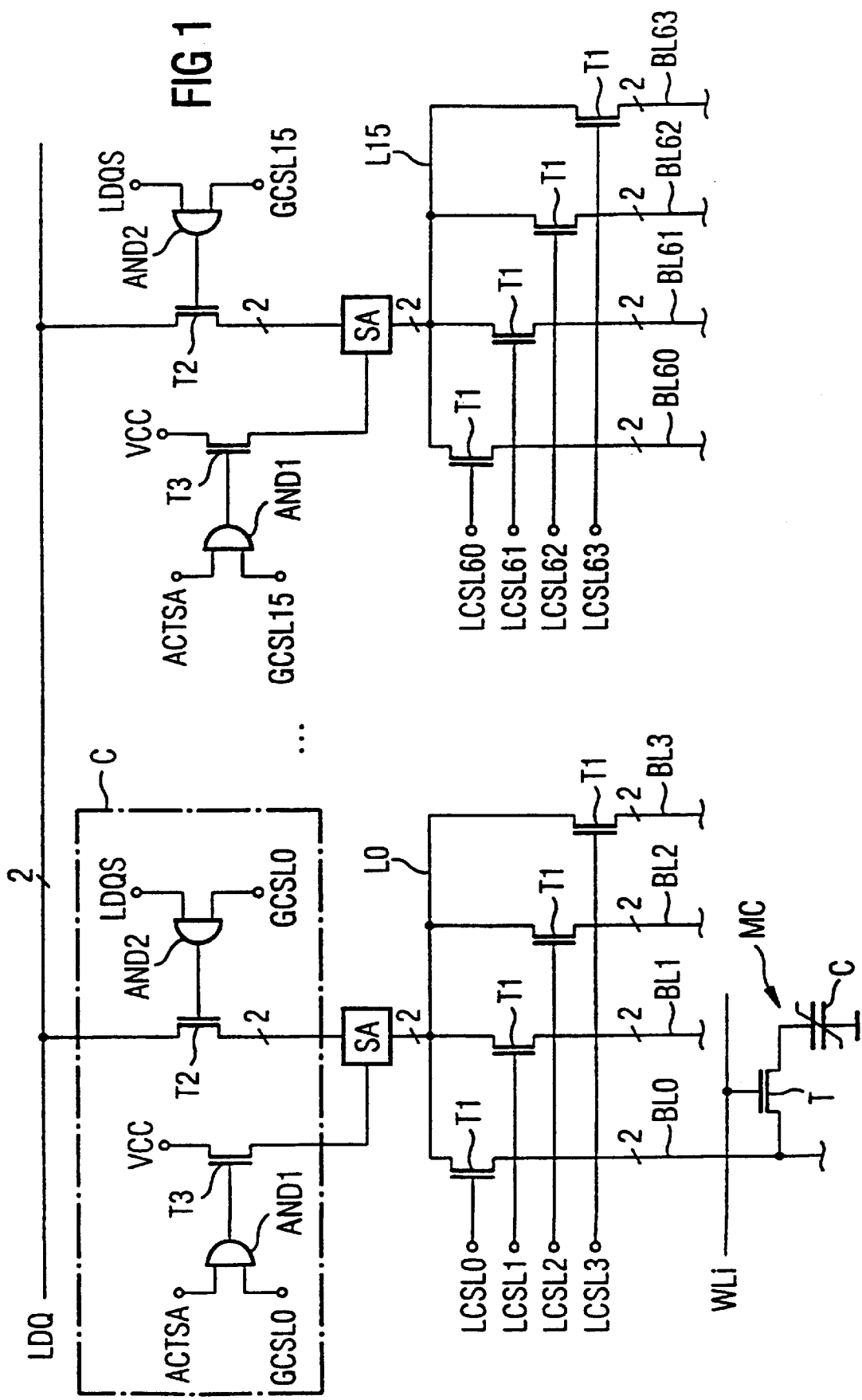
FIG. 1 is a diagrammatic view of a detail of a first exemplary embodiment of the memory device according to the invention.

Referring now to the figures of the drawing in detail and first, particularly, to FIG. 1 thereof, there is seen a first exemplary embodiment of the integrated memory according to the invention. Reference is had, by way of example, a ferroelectric memory (FRAM) is involved. However, the invention is also suitable for other memories, such as DRAMs for example. The memory has a large number of sense amplifiers SA, only two of which are illustrated in FIG. 1. Further sense amplifiers are indicated by three dots in FIG. 1. Each sense amplifier SA is on the one hand connected to the two bit lines of a respective bit line pair BLi via a line pair Lo and a respective first switching element T1 in the form of an n-channel transistor. Of the line pairs Li and the bit line pairs BLi, in each case only one line and one bit line, respectively, are illustrated in FIG. 1. In this case, each bit line of a bit line pair is in reality assigned its own first switching element T1. Each of the bit lines BLi is connected to a large number of memory cells MC each having a selection transistor T and a storage capacitor C with a ferro-electric dielectric. These are generally known memory cells of the 1-transistor/1-capacitor type. A control terminal of the selection transistor T of each memory cell MC is connected to a word line WLi.

Each sense amplifier SA is on the other hand connected to the lines of a data line pair LDQ via two second switching elements T2 in the form of n-channel transistors. In the event of a write access, data are transferred via the data line pair LDQ, one of the sense amplifiers SA, the associated line pair Li and also one of the bit line pairs BLi—connected to said line pair Li—to one of the memory cells MC, and stored there. In the event of a read access, the data transfer takes place in the opposite direction. The word lines WLi and the bit lines BLi are addressed in order to determine which of the memory cells MC is accessed in the event of a write or read access. Depending on this addressing, only one of the bit line pairs BLi is simultaneously connected via its first switching elements T1 to the associated sense amplifier SA. Moreover, only one of the sense amplifiers SA is in each case connected via its second switching elements T2 to the data line pair LDQ. The sense amplifiers SA are differential amplifiers that are customary in DRAMs or FRAMS. However, the invention can also be applied to memories which have simple, non-differential sense amplifiers and in which the data transfer does not take place via bit line pairs but rather via only one individual bit line in each case.

Figure 2:
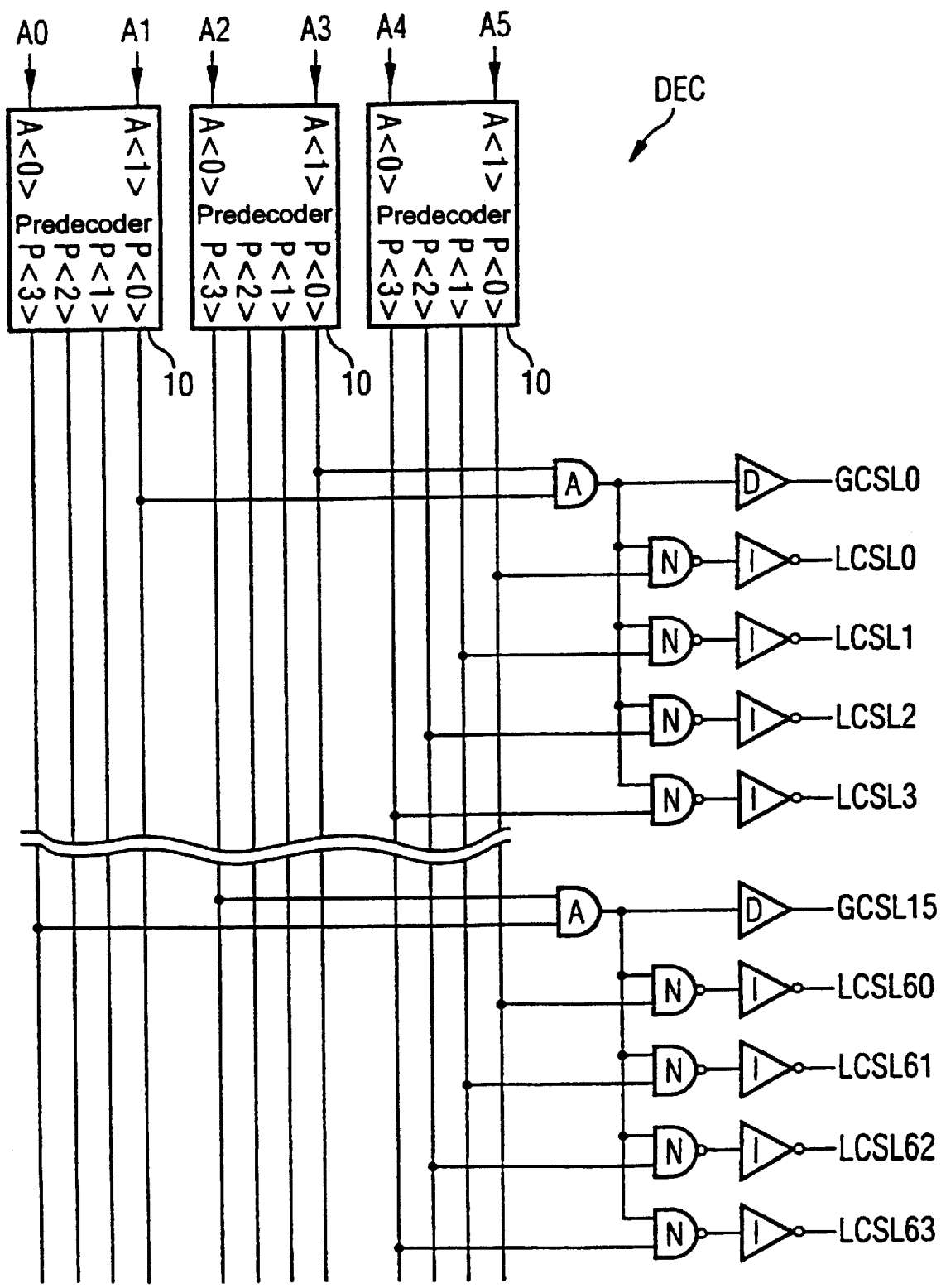
FIG. 2 is a diagrammatic view of an exemplary embodiment of a hierarchical decoder of the integrated memory of FIG. 1.
Figure 3:
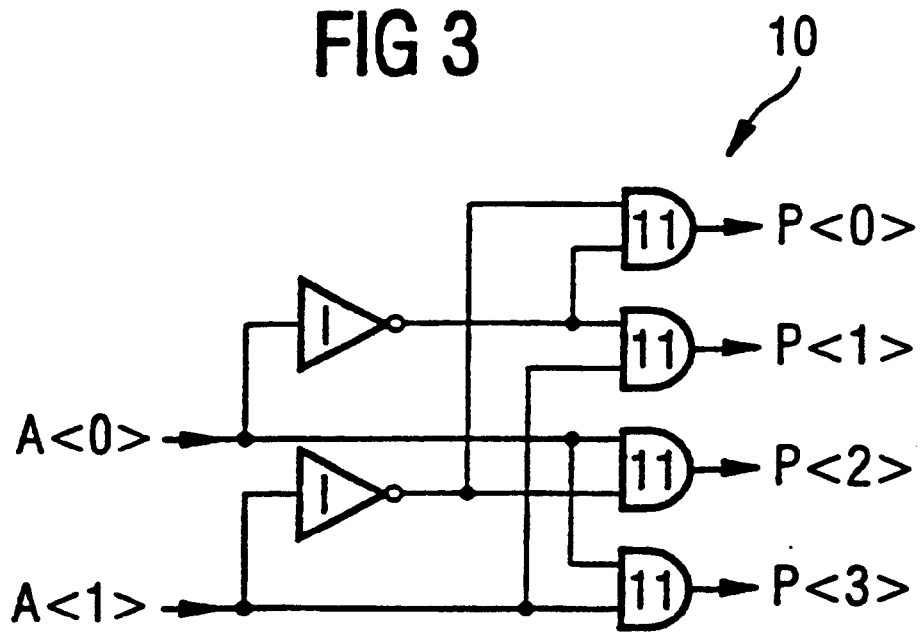
FIG. 3 is a detail of the decoder shown in FIG. 2.

FIG. 2 shows a column decoder DEC for column addresses Ai. The column addresses Ai are in each case fed in pairs to a respective predecoder 10, which generates four predecoded address signals P<i> at its outputs. The construction of one of the predecoders 10 from FIG. 2 is illustrated in FIG. 3. It has four AND gates 11, at whose outputs the predecoded addresses P<i> are generated. An in each case different combination of the inverted or non-inverted input signals A<i> of the predecoder 10 is fed to the in each case two inputs of the AND gates 11. The inverted version of each of these input signals is generated by means of a respective inverter I.

The decoder DEC in FIG. 2 has, connected downstream of the predecoders 10, a multiplicity of first decoder stages A in the form of AND gates and, in turn respectively connected downstream of the first decoder stages, in each case four second decoder stages N in the form of NAND gates with a respective inverter I connected downstream. Each first decoder stage A, just two of which are illustrated in FIG. 2, has two inputs to which in each case different combinations of the predecoded addresses P<i> are fed. Each second decoder stage N has two inputs, a respective one of which is connected to the output of the associated first decoder stage A, while a further one of the predecoded addresses is respectively fed to the other input.

In the case of the column decoder DEC illustrated in FIG. 2, the first decoder stages A generate, via a driver D connected downstream, global column select signals GCSLi at an output.

The second decoder stages N in each case generate local column select signals LCSLi at their outputs. In each case only one of the local column select signals LCSLi can have a high level whose associated first decoder stage A likewise has a high level at its output.

FIG. 1 reveals that the outputs of the second decoder stages N are connected to control inputs of the first switching elements T1. Thus, one of the bit line pairs BLi is selected via the local column select signals LCSLi. Consequently, it is ensured that only ever one of the bit line pairs BLi is simultaneously connected to the associated sense amplifier SA. FIG. 1 also reveals that the outputs of the first decoder stages A from FIG. 2 are connected to a first input of a respective first AND gate AND1, which are respectively assigned to one of the sense amplifiers SA. A second input of all the first AND gates AND1 is connected to an activation signal ACTSA, via which the evaluation by one of the sense amplifiers SA is started. An output of each first AND gate AND1 is connected to a respective control input of an n-channel transistor T3 which, via its path to be controlled, connects the associated sense amplifier SA to a supply potential VCC. Since in each case only one of the global column select signals GCSLi has a high level at the same point in time, only one of the sense amplifiers SA is connected to the supply potential VCC when the activation signal ACTSA is activated. Consequently, only this sense amplifier SA is subsequently activated and, in the event of a read access, can forward signals present on the line pair Li to the data line pair LDQ after having amplified them or, in the event of a write access, can transfer data from the data line pair LDQ to the line pair Li.

FIG. 1 also shows second AND gates AND2, whose output is connected to a respective control input of one of the second switching elements T2. A first input of the second AND gates AND2 is connected to a control signal LDQS, which is the same for all the second switching elements T2. A second input of each second AND gate AND2 is connected to a respective one of the outputs of the first decoder stages A of the column decoder DEC in FIG. 2, with the result that different global column select signals GCSLi are in each case fed to the second AND gates AND2. Thus, in the case of the memory shown in FIG. 1, said column select signals are also used to effect the selection of which of the sense amplifiers SA is connected to the data line pair LDQ, provided that the control signal LDQs has a high level.

In the case of the memory illustrated in FIG. 1, write or read accesses to the memory cells MC are thus influenced in two different ways via the global column select signals GCSLi: firstly, in the event of a positive edge of the activation signal ACTSA, only that sense amplifier SA whose global column select signal GCSLi has a high level is connected to the supply potential VCC. Moreover, it is also the case that only this sense amplifier SA is connected to the data line pair LDQ via its second switching elements T2, likewise in a manner dependent on its global column select signal GCSLi, in the event of a positive edge of the control signal LDQS. In other embodiments of the invention, it is also possible, of course, for only one of these two kinds of influencing to be provided.

Figure 5:
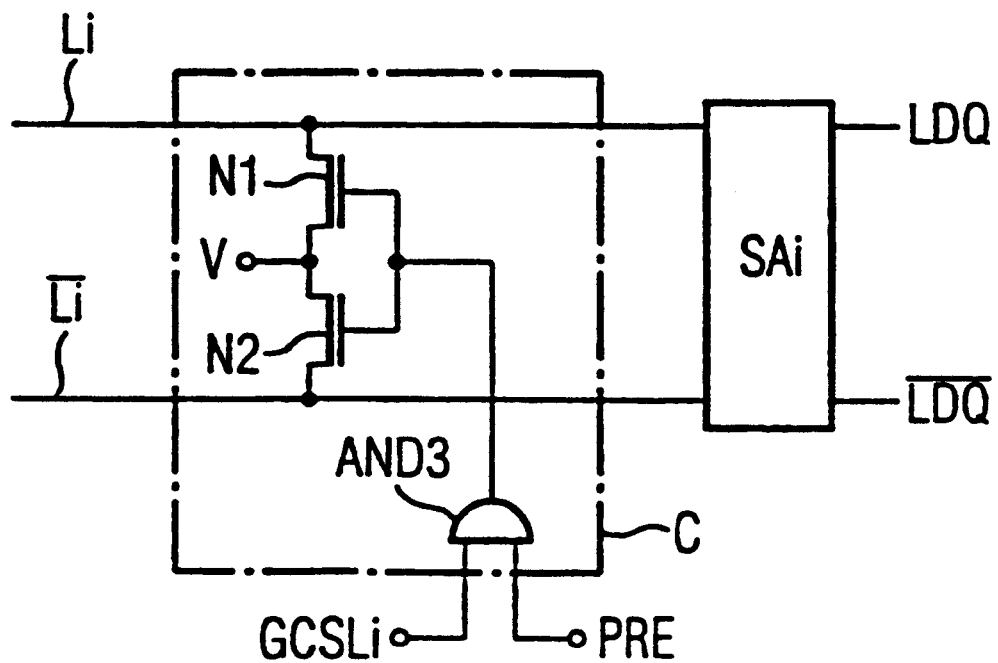
FIG. 5 is a detail of a further embodiment of the integrated memory with a precharge unit.

In other embodiments of the invention, it is furthermore possible for the write or read accesses to be influenced by the output signals of the first decoder stages A from FIG. 2 in a third way, as an alternative or in addition to the two kinds of influencing just described. This third possibility is shown in FIG. 5. There, one of the sense amplifiers Sai is connected on the one hand to its line pair Li, /Li and on the other hand to the data line pair LDQ, /LDQ. The two lines Li, /Li are connected to one another via the controllable paths of a first n-channel transistor N1 and of a second n-channel transistor N2. The common channel terminal of the two transistors N1, N2 is connected to a fixed potential V. The latter serves for precharging the lines Li, /Li. The control terminals of the two transistors N1, N2 are connected to one another and to the output of a third AND gate AND3. One input of the third AND gate AND3 is connected to a precharge signal PRE and the other input of the third AND gate AND3 is connected to the global column select signal GCSLi assigned to the sense amplifier SAi. A precharge circuit of this type is assigned to each sense amplifier SAi. The precharge signal PRE is the same for all the precharge circuits. However, the precharging is effected only for that line pair Li, /Li for which the associated global column select signal GCSLi has a high level.

The circuit units C which serve for influencing the write or read accesses in a manner dependent on the output signals of the first decoder stages A are depicted by broken lines in FIGS. 1 and 5. In FIG. 5, the circuit unit C is the precharge circuit.

Figure 4:
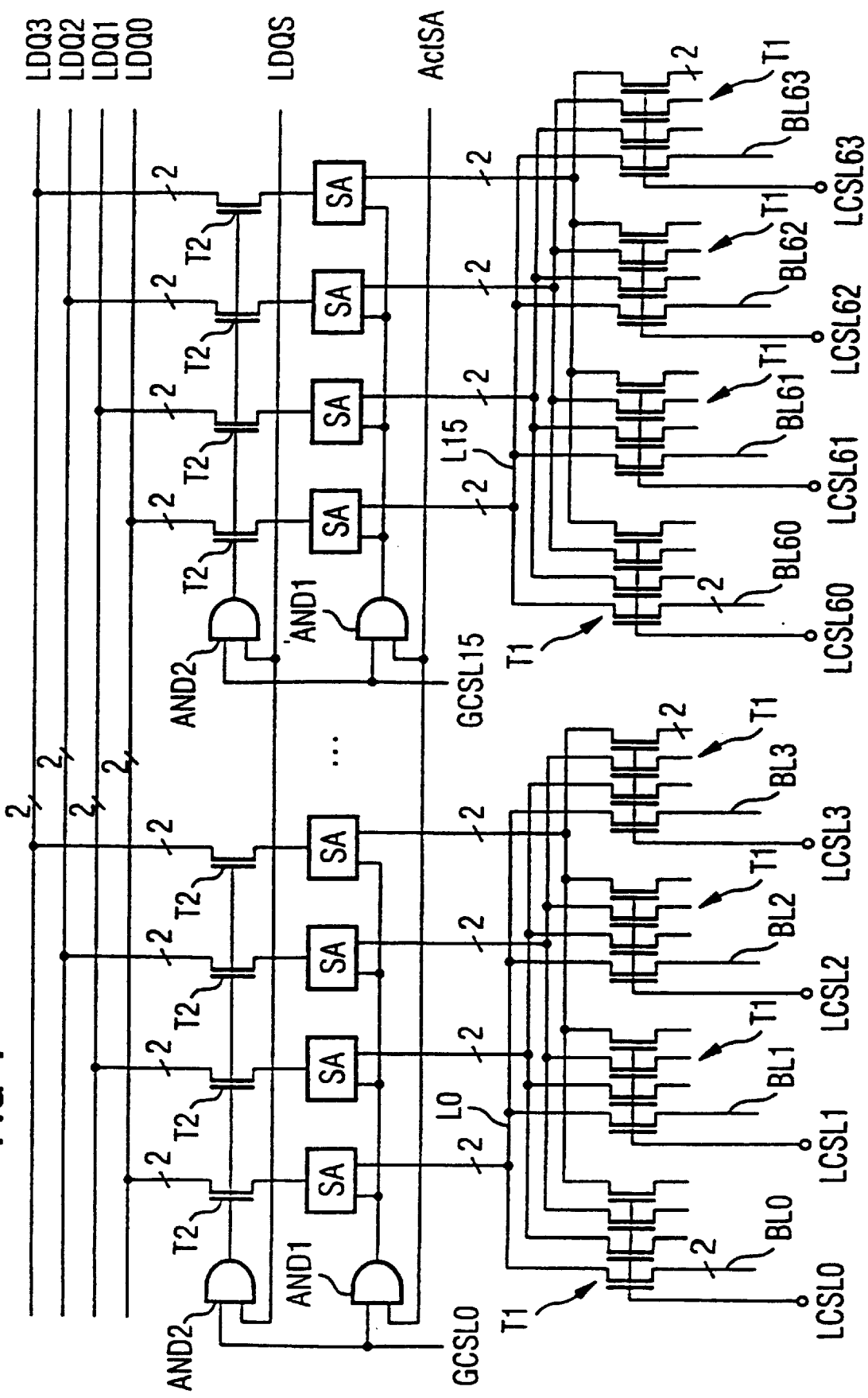
FIG. 4 is a diagrammatic view of a second exemplary embodiment of the integrated memory device.

FIG. 4 reveals a further exemplary embodiment of the integrated memory, which differs from that in FIG. 1 in that four data line pairs LDQi are present instead of an individual data line pair LDQ, with the result that four sense amplifiers SA connected to a respective one of the data line pairs LDQi via corresponding second switching elements T2 can simultaneously serve for transferring data. The column decoder DEC for this exemplary embodiment corresponds to that from FIG. 2. Each local column select signal LCSLi in FIG. 4, which is one of the output signals of the second decoder stages N from FIG. 2, is connected, for each of the sense amplifiers SA that can be activated simultaneously, to a respective first switching element T1 assigned to said sense amplifier. Consequently, via the local column select signals LCSLi, in each case four bit line pairs BLi are simultaneously connected to each of the four sense amplifiers SA that can be activated simultaneously. In this case, the sense amplifiers SA are only activated if both the activation signal ACTSA, which is the same for all the sense amplifiers, and the corresponding global column select signal GCSLi have a high level. Moreover, the four sense amplifiers SA are connected to the data line pairs LDQi via the second switching elements T2 only when both the control signal LDQS, which is the same for all the sense amplifiers, and the global column select signal GCSLi assigned to the respective sense amplifiers SA have a high level. In order that it is always four sense amplifiers that are activated simultaneously and connected to the data line pairs LDQi, a common global column select signal GCSLi is assigned in each case to these four sense amplifiers SA in the case of the integrated memory in accordance with FIG. 4.

In the exemplary embodiments outlined, it is always the case that firstly the decoding of the column addresses by the column decoder DEC and the generation of the local LCSLi and global GCSLi column select signals take place before the activation signal ACTSA, the control signal LDQS and the precharge signal PRE are activated with a positive edge. This ensures that the column select signals LCSLi, GCSLi are already present in fully decoded form and the sense amplifiers SA are already connected to the corresponding bit line pairs BLi before the line pairs Li are precharged (as a result of which the corresponding bit line pair is automatically precharged with the latter), and then the sense amplifier is activated for evaluation of the differential signal— established after activation of one of the word lines WLi— on the line pair Li and, finally, the connection between the sense amplifiers and the data line pairs is produced. By virtue of the fact that the activation signal ACTSA, the precharge signal PRE and the control signal LDQS are the same for all the sense amplifiers SA, the processes triggered by them take place in a defined manner for all the write/read accesses.

We claim:

1. An integrated memory, comprising:

a plurality of memory cells and a number m>1 bit lines connected to said memory cells, switching elements connected to said bit lines and each having a control input, a sense amplifier having an input connected via said switching elements to said bit lines for transferring data from or to said memory cells;

a circuit unit for influencing write or read operations via said sense amplifier and said bit lines, said circuit unit having an activation input for placing said circuit unit into an activated state;

a column decoder having a first decoder stage and m second decoder stages;

said first decoder stage having inputs for receiving address signals and an output connected to said activation input of said circuit unit; and said second decoder stages each having an input connected to said output of said first decoder stage, at least one further input for receiving a further address signal, and an output connected to said control input of a respective one of said switching elements.

2. The integrated memory according to claim 1, wherein said circuit unit is configured to activate said sense amplifier in the activated state.

3. The integrated memory according to claim 1, wherein said circuit unit connects said sense amplifier to a data line in the activated state, said data line serving for transferring, to a point outside the integrated memory, data that have been read from said memory cells and amplified by said sense amplifier.

4. The integrated memory according to claim 1, wherein said circuit unit is configured to precharge said input of said sense amplifier to a given potential in the activated state.

* * * * *